(12) United States Patent
Wei et al.

(10) Patent No.: US 8,034,459 B2
(45) Date of Patent: Oct. 11, 2011

(54) EROSION RESISTANT COATINGS

(75) Inventors: Ronghua Wei, San Antonio, TX (US);
Edward Langa, San Antonio, TX (US);
James H. Arps, San Antonio, TX (US);
Christopher Rincon, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 1239 days.

(21) Appl. No.: 11/550,718

(22) Filed: Oct. 18, 2006

(65) Prior Publication Data
US 2007/0087185 A1    Apr. 19, 2007

Related U.S. Application Data

(60) Provisional application No. 60/728,425, filed on Oct. 18, 2005.

(51) Int. Cl.
*C23C 16/00* (2006.01)
*H05H 1/24* (2006.01)

(52) U.S. Cl. ........ 428/446; 428/448; 428/451; 428/452; 428/312.2; 428/469; 428/312.8; 204/192.15; 427/248.1; 427/569

(58) Field of Classification Search .................. None
See application file for complete search history.

(56) References Cited

U.S. PATENT DOCUMENTS

| | | | |
|---|---|---|---|
| 4,588,490 A | 5/1986 | Cuomo et al. | |
| 5,122,252 A | 6/1992 | Latz et al. | |
| 5,178,739 A | 1/1993 | Barnes et al. | |
| 5,308,806 A * | 5/1994 | Maloney et al. | 501/95.2 |
| 5,309,874 A | 5/1994 | Willermet et al. | |
| 5,346,600 A | 9/1994 | Nieh et al. | |
| 5,824,198 A | 10/1998 | Williams | |
| 5,858,471 A | 1/1999 | Ray et al. | |
| 5,948,215 A | 9/1999 | Lantsman | |
| 6,054,188 A | 4/2000 | Tropsha et al. | |
| 6,087,025 A | 7/2000 | Dearnaley et al. | |
| 6,500,742 B1 * | 12/2002 | Chern et al. | 438/582 |
| 6,504,151 B1 | 1/2003 | Mitchell et al. | |
| 6,548,161 B1 | 4/2003 | Torigoe et al. | |
| 6,585,870 B1 | 7/2003 | Pitcher et al. | |
| 6,599,399 B2 | 7/2003 | Xu et al. | |
| 6,699,530 B2 * | 3/2004 | Danek et al. | 427/535 |

(Continued)

FOREIGN PATENT DOCUMENTS
JP    2000326108    11/2000

OTHER PUBLICATIONS

Diserens et al. Surface and Coating Technology, 108-109, 1998, 241-246.*
Niederhofer et. al. Surface and Coating Technology, 120-121, 1999, 173-178.*
International Search Report and Written Opinion of the International Searching Authority (ISA/US) mailed Sep. 25, 2007; issued in the counterpart International Appln. No. PCT/US06/60053 filed Oct. 18, 2006.

(Continued)

*Primary Examiner* — Jennifer McNeil
*Assistant Examiner* — Vera Katz
(74) *Attorney, Agent, or Firm* — Grossman, Tucker et al.

(57) ABSTRACT

The present disclosure relates to a coating and a method of applying such coating that may include nanocrystals of a transition metal compound embedded in an amorphous phase or layered structure of transition metal compounds with an amorphous phase. The transition metal compound may be selected from the group consisting of metal nitrides, metal carbides, metal silicides and combinations thereof. The amorphous matrix may include a ceramic.

18 Claims, 7 Drawing Sheets

U.S. PATENT DOCUMENTS

| | | | |
|---|---|---|---|
| 6,767,436 B2 | 7/2004 | Wei | |
| 6,896,773 B2 | 5/2005 | Chistyakov | |
| 6,896,775 B2 | 5/2005 | Chistyakov | |
| 6,923,885 B2 | 8/2005 | Masuda et al. | |
| 7,067,002 B2 | 6/2006 | Schmidt et al. | |
| 7,258,912 B2 | 8/2007 | Yamamoto et al. | |
| 2001/0025205 A1* | 9/2001 | Chern et al. | 700/121 |
| 2002/0001976 A1* | 1/2002 | Danek et al. | 438/798 |
| 2002/0132132 A1 | 9/2002 | Bose et al. | |
| 2002/0197502 A1 | 12/2002 | Zhao et al. | |
| 2004/0055870 A1 | 3/2004 | Wei | |
| 2004/0099215 A1* | 5/2004 | Danek et al. | 118/723 E |
| 2004/0144318 A1* | 7/2004 | Beck et al. | 118/723 R |
| 2004/0244653 A1 | 12/2004 | Schmidt et al. | |
| 2004/0259366 A1* | 12/2004 | Kim et al. | 438/691 |
| 2005/0011748 A1 | 1/2005 | Beck et al. | |
| 2005/0170162 A1 | 8/2005 | Yamamoto et al. | |
| 2006/0147728 A1* | 7/2006 | Shen et al. | 428/446 |
| 2006/0166019 A1* | 7/2006 | Spitsberg et al. | 428/471 |
| 2007/0284255 A1* | 12/2007 | Gorokhovsky et al. | 205/89 |
| 2009/0214787 A1 | 8/2009 | Wei | |
| 2010/0068556 A1 | 3/2010 | Lemmon et al. | |
| 2010/0104859 A1* | 4/2010 | Berczik et al. | 428/332 |

OTHER PUBLICATIONS

Poiré, Ethal. Micro Photonics Inc. "Analytical Report NHT-020802". Method: Nano Hardness Tester (NHT). Sample(s) Optical fiber w/connecter. Customer: Megladon Manufacturing Gp. Date: Aug. 2, 2002. 8pgs.

Seal, Sudipta. "Transition Metal Nitride Functional Coatings". JOM; Functional Coatings Overview. Dated: Sep. 2001. 1 pg.

Swann, S. "Magnetron Sputtering". Phys. Technol. 19. Dated: 1988. 9pgs. IOP Publishing Ltd. Printed in the UK.

Ding et al., Mechanical properties and wear resistance of multilayer thin coatings on cutting tools, Journal of Tribology, vol. 20, No. 3, pp. 170-174 Jun. 30, 2000.

Oliver, et al., "An improved technique for determining hardness and elastic modulus using load and displacement sensing indentation experiments," J. Mater. Res., vol. 7, No. 6, Jun. 1992, pp. 1564-1583.

ASTM International, "Standard Test Method for Conducting Erosion Tests by Solid Particle Impingement Using Gas Jets," Designation G76-07.

Chinese Office Action dated Jan. 29, 2010 issued in relation Chinese Patent Application No. 200680035958.8.

Chinese Office Action dated Sep. 2, 2010 issued in relation Chinese Patent Application No. 200680035958.8.

Anton et al., Thermal Cycling Testing of Thermal Barrier Coatings, Cyclic Oxidation of High Temperature Materials, Chapter 21, 1999, pp. 339-356.

Chan et al., Degradation Mechanism Characterization and Remaining Life Prediction for NiCoCrAlY Coatings, Proceedings of ASME Turbo Expo 2004, Power for Land, Sea, and Air, Jun. 14-17, 2004, pp. 1-8, Vienna, Austria.

Chen et al., Oxidation behavior of sputtered Ni-3Cr-20Al nanocrystalline coating, Materials Science and Engineering, 1999, pp. 360-365.

Chen et al., the Mechanism of Oxidation of Sputtered Ni-Cr-Al Nanocrystalline Coatings, Corrosion Reviews, 2000, pp. 195-204, vol. 18, Nos. 2-3.

Cheruvu et al., Cyclic Oxidation Behavior and Microstructure of Nanocrystalline Ni-20Cr-4Al Coating, Oxid Met, 2010, pp. 493-511, 73.

Cheruvu et al., Effect of Time and Temperature on Thermal Barrier Coating Failure Mode Under Oxidizing Environment, Journal of Engineering for Gas Turbines and Power, Mar. 2009, 7 pages, vol. 131.

Cheruvu et al., Evaluation, degradation and life assessment of coatings for land based combustion turbines, Energy Materials, 2006, pp. 33-47, vol. 1.

Cheruvu et al., In-service Degradation and Life Prediction of Coatings for Advanced Land-based Gas Turbine Buckets*, JSME International Journal, 2003, pp. 635-641, Series A, vol. 46, No. 4.

Gao et al., Nano- and Microcrystal Coatings and Their High-Temperature Applications**, Advanced Materials, Jul. 4, 2001, pp. 1001-1004, vol. 13, No. 12-13.

Geng et al., Hot-Corrosion Resistance of a Sputtered K38G Nanocrystalline Coating in Molten Sulfate at 900°C, Oxidation of Metals, Jun. 2002, pp. 549-557, vol. 57, Nos. 5/6.

Harvey, What is an MCrAlY coating?, http://www.twi.co.uk/content/faqmdfh005.html, downloaded from internet Mar. 24, 2010, 2 pages.

Hass, Thermal Barrier Coatings, Chapter 2, Directed Vapor Deposition of Thermal Barrier Coatings, 2000, Ph.D. Dissertation, University of Virginia, pp. 6-20.

Liu et al., Cyclic Oxidation of Sputter-Deposited Nanocrystalline Fe-Cr-Ni-Al Alloy Coatings, Oxidation of Metals, 1999, pp. 403-419, vol. 51, Nos. 5/6.

Liu et al., Improved Oxide Spallation Resistance of Microcrystalline Ni-Cr-Al Coatings, Oxidation of Metals, 1998, pp. 51-69, vol. 50, Nos. 1/2.

Liu et al., Oxidation behaviour of nanocrystalline Fe-Ni-Cr-Al alloy coatings, Material Science and Technology, Dec. 1999, pp. 1447-1450, vol. 15.

Liu et al., Oxidation Behaviour of Sputter-Deposited Ni-Cr-Al Micro-Crystalline Coatings, Elsevier Science Ltd., 1998, pp. 1691-1700, vol. 46, No. 5.

Liu et al., The Effect of Coating Grain Size on the Selective Oxidation Behaviour of Ni-Cr-Al Alloy, Elsevier Science Ltd, 1997, pp. 1551-1558, vol. 37, No. 10.

Merceron et al., Long Term Oxidation of FeCrAl ODS Alloys at High Temperature, Materials Science Forum, 2001, pp. 269-276, vols. 369-372.

Miller, Current Status of Thermal Barrier Coatings—An Overview*, Surface and Coatings Technology, 1987, pp. 1-11, 30.

Movchan et al., Two- and three-layer coatings produced by deposition in vacuum for gas turbine blade protection, Surface and Coatings Technology, 1994, pp. 55-63, 67.

Padture et al., Thermal Barrier Coatings for Gas-Turbine Engine Applications, Science—Science's Compass—Review, Apr. 12, 2002, pp. 280-284, vol. 296.

Stiger et al., Mechanisms for the Failure of Electron Beam Physical Vapor Deposited Thermal Barrier Coatings Induced by High Temperature Oxidation, Elevated Temperature Coatings: Science and Technology III,The Minerals, Metals & Materials Society, 1999, pp. 51-65.

Uusitalo et al., High temperature corrosion of coatings and boiler steels in reducing chlorine-containing atmosphere, Surface and Coatings Technology, 2002, pp. 275-285, 161.

Vacuum Turbine Blade Coating—Electron Beam / Physical Vapor Deposition (EB/PVD) of Protective MCrAlY) and Thermal Barrier Coatings (TBC) The Solution ALD, http://web.ald-vt.de/cms/vakuum-technologie/anlagen/edpve/, downloaded from interned Mar. 24, 2010, 3 pages.

Wang, The Effect of Nanocrystallization on the Selective Oxidation and Adhesion of Al2O3 Scales, Oxidation of Metals, 1997, pp. 215-224, vol. 48, Nos. 3/4.

Wang et al., The Mechanism of Scale Adhesion on Sputtered Microcrystallized CoCrAl Films, Oxidation of Metals, 1996, pp. 39-50, vol. 45, Nos. 1/2.

Wei et al., Deposition of thick nitrides and carbonitrides for sand erosion protection, Surface & Coatings Technology, 2006, pp. 4453-4459, 201.

Wei, Plasma Enhanced Magnetron Sputter (PEMS) Deposition of Thick Nanocomposite Coatings for Erosion Protection, Chapter 6, Nanocomposite Coatings and Nanocomposite Materials, pp. 239-269.

Wei, Plasma enhanced magnetron sputter deposition of Ti-Si-C-N based nanocomposite coatings, Surface & Coatings Technology, 2008, pp. 538-544, 203.

Wei, Plasma enhanced magnetron sputtering deposition of superhard, nanocomposite coatings, Plasma Surface Engineering Research and its Practical Applications, 2008, pp. 87-111.

Wei, Solid Particle Erosion Protection of Turbine Blades with Thick Nitride and Carbonitride Coatings from Magnetron Sputter Deposition, Proceedings of the 5th International Surface Engineering Congress, May 15-17, 2006, pp. 78-84.

Wright et al., Influence of Aluminum Depletion Effects on the Calculation of the Oxidation Lifetimes of FeCrAl Alloys, Materials Science Forum, 2004, pp. 579-590, vols. 461-464.

Zhang et al., Hot Corrosion of an Electrodeposited Ni-11 wt % Cr Nanocomposite under Molten Na2SO4-K2SO4-NaCl, Journal of the Electrochemical Society, 2005, pp. B321-B326.

Jbaker.Com, "Hexamethyldisilozane," available at www.jbaker.com/msds/englishhtml/h2066.htm; retrieved on Feb. 5, 2009. 5 pages.

Science Lab.Com, "Material Safety Data Sheet, Hexamethyldisiloxane MSDS," available at http://www.sciencelab.com/xMSDS-Hexamethyldisiloxane-9924249, retrieved on May 1, 2009. 6 pages.

Anton et al., Thermal Cycling Testing of Thermal Barrier Coatings, Cyclic Oxidation of High Temperature Materials, Chapter 21, 1999, pp. 339-356.

Chan et al., Degradation Mechanism Characterization and Remaining Life Prediction for NiCoCrAlY Coatings, Proceedings of ASME Turbo Expo 2004, Power for Land, Sea, and Air, Jun. 14-17, 2004, pp. 1-8, Vienna, Austria.

Chen et al., Oxidation behavior of sputtered Ni-3Cr-20Al nanocrystalline coating, Materials Science and Engineering, 1999, pp. 360-365.

Chen et al., The Mechanism of Oxidation of Sputtered Ni-Cr-Al Nanocrystalline Coatings, Corrosion Reviews, 2000, pp. 195-204, vol. 18, Nos. 2-3.

Cheruvu et al., Cyclic Oxidation Behavior and Microstructure of Nanocrystalline Ni-20Cr-4Al Coating, Oxid Met, 2010, pp. 493-511, 73.

Cheruvu et al., Effect of Time and Temperature on Thermal Barrier Coating Failure Mode Under Oxidizing Environment, Journal of Engineering for Gas Turbines and Power, Mar. 2009, 7 pages, vol. 131.

Cheruvu et al., Evaluation, degradation and life assessment of coatings for land based combustion turbines, Energy Materials, 2006, pp. 33-47, vol. 1.

Cheruvu et al., In-service Degradation and Life Prediction of Coatings for Advanced Land-based Gas Turbine Buckets*, JSME International Journal, 2003, pp. 635-641, Series A, vol. 46, No. 4.

Gao et al., Nano- and Microcrystal Coatings and Their High-Temperature Applications**, Advanced Materials, Jul. 4, 2001, pp. 1001-1004, vol. 13, No. 12-13.

Geng et al., Hot-Corrosion Resistance of a Sputtered K38G Nanocrystalline Coating in Molten Sulfate at 900°C, Oxidation of Metals, Jun. 2002, pp. 549-557, vol. 57, Nos. 5/6.

Harvey, What is an MCrAlY coating?, http://www.twi.co.uk/content/faqmdfh005.html, downloaded from internet Mar. 24, 2010, 2 pages.

Hass, Thermal Barrier Coatings, Chapter 2, Directed Vapor Deposition of Thermal Barrier Coatings, 2000, Ph.D. Dissertation, University of Virginia, pp. 6-20.

Liu et al., Cyclic Oxidation of Sputter-Deposited Nanocrystalline Fe-Cr-Ni-Al Alloy Coatings, Oxidation of Metals, 1999, pp. 403-419, vol. 51, Nos. 5/6.

Liu et al., Improved Oxide Spallation Resistance of Microcrystalline Ni-Cr-Al Coatings, Oxidation of Metals, 1998, pp. 51-69, vol. 50, Nos. 1/2.

Liu et al., Oxidation behaviour of nanocrystalline Fe-Ni-Cr-Al alloy coatings, Material Science and Technology, Dec. 1999, pp. 1447-1450, vol. 15.

Liu et al., Oxidation Behaviour of Sputter-Deposited Ni-Cr-Al Micro-Crystalline Coatings, Elsevier Science Ltd., 1998, pp. 1691-1700, vol. 46, No. 5.

Liu et al., The Effect of Coating Grain Size on the Selective Oxidation Behaviour of Ni-Cr-Al Alloy, Elsevier Science Ltd, 1997, pp. 1551-1558, vol. 37, No. 10.

Merceron et al., Long Term Oxidation of FeCrAl ODS Alloys at High Temperature, Materials Science Forum, 2001, pp. 269-276, vols. 369-372.

Miller, Current Status of Thermal Barrier Coatings—An Overview*, Surface and Coatings Technology, 1987, pp. 1-11, 30.

Movchan et al., Two- and three-layer coatings produced by deposition in vacuum for gas turbine blade protection, Surface and Coatings Technology, 1994, pp. 55-63, 67.

Padture et al., Thermal Barrier Coatings for Gas-Turbine Engine Applications, Science—Science's Compass—Review, Apr. 12, 2002, pp. 280-284, vol. 296.

Stiger et al., Mechanisms for the Failure of Electron Beam Physical Vapor Deposited Thermal Barrier Coatings Induced by High Temperature Oxidation, Elevated Temperature Coatings: Science and Technology III, The Minerals, Metals & Materials Society, 1999, pp. 51-65.

Uusitalo et al., High temperature corrosion of coatings and boiler steels in reducing chlorine-containing atmosphere, Surface and Coatings Technology, 2002, pp. 275-285, 161.

Vacuum Turbine Blade Coating—Electron Beam / Physical Vapor Deposition (EB/PVD) of Protective MCrAlY) and Thermal Barrier Coatings (TBC) the Solution ALD, http://web.ald-vt.de/cms/vakuum-technologie/anlagen/edpve/, downloaded from interned Mar. 24, 2010, 3 pages.

Wang, The Effect of Nanocrystallization on the Selective Oxidation and Adhesion of Al2O3 Scales, Oxidation of Metals, 1997, pp. 215-224, vol. 48, Nos. 3/4.

Wang et al., The Mechanism of Scale Adhesion on Sputtered Microcrystallized CoCrAl Films, Oxidation of Metals, 1996, pp. 39-50, vol. 45, Nos. 1/2.

Wei et al., Deposition of thick nitrides and carbonitrides for sand erosion protection, Surface & Coatings Technology, 2006, pp. 4453-4459, 201.

Wei, Plasma Enhanced Magnetron Sputter (PEMS) Deposition of Thick Nanocomposite Coatings for Erosion Protection, Chapter 6, Nanocomposite Coatings and Nanocomposite Materials, pp. 239-269.

Wei, Plasma enhanced magnetron sputter deposition of Ti-Si-C-N based nanocomposite coatings, Surface & Coatings Technology, 2008, pp. 538-544, 203.

Wei, Plasma enhanced magnetron sputtering deposition of superhard, nanocomposite coatings, Plasma Surface Engineering Research and its Practical Applications, 2008, pp. 87-111.

Wei, Solid Particle Erosion Protection of Turbine Blades with Thick Nitride and Carbonitride Coatings from Magnetron Sputter Deposition, Proceedings of the 5th International Surface Engineering Congress, May 15-17, 2006, pp. 78-84.

Wright et al., Influence of Aluminum Depletion Effects on the Calculation of the Oxidation Lifetimes of FeCrAl Alloys, Materials Science Forum, 2004, pp. 579-590, vols. 461-464.

Zhang et al., Hot Corrosion of an Electrodeposited Ni-11 wt % Cr Nanocomposite under Molten Na2SO4-K2SO4-NaCl, Journal of the Electrochemical Society, 2005, pp. B321-B326.

Jbaker.Com, "Hexamethyldisilozane," available at www.jbaker.com/msds/englishhtml/h2066.htm; retrieved on Feb. 5, 2009. 5 pages.

Science Lab.Com, "Material Safety Data Sheet, Hexamethyldisiloxane MSDS," available at http://www.sciencelab.com/xMSDS-Hexamethyldisiloxane-9924249, retrieved on May 1, 2009. 6 pages.

Ding et al., Mechanical properties and wear resistance of multilayer thin coatings on cutting tools, Journal of Tribology, vol. 20, No. 3, pp. 170-174 Jun. 30, 2000.

Oliver, et al., "An improved technique for determining hardness and elastic modulus using load and displacement sensing indentation experiments," J. Mater. Res., vol. 7, No. 6, Jun. 1992, pp. 1564-1583.

ASTM International, "Standard Test Method for Conducting Erosion Tests by Solid Particle Impingement Using Gas Jets," Designation G76-07.

Chinese Office Action dated Jan. 29, 2010 issued in relation Chinese Patent Application No. 200680035958.8.

Chinese Office Action dated Sep. 2, 2010 issued in relation Chinese Patent Application No. 200680035958.8.

* cited by examiner

EROSION RESISTANT COATINGS

CROSS REFERENCE TO RELATED APPLICATIONS

The present application claims the benefit of the filing date of U.S. Provisional Application Ser. No. 60/728,425 filed Oct. 18, 2005, the teachings of which are incorporated herein by reference.

FIELD OF INVENTION

The present invention relates to erosion resistant coatings comprising metal nitrides, metal carbides, metal silicides, and combinations thereof.

BACKGROUND

Components such as gas turbine compressor blades of aircraft engines, as well as the rotors for helicopters, are subject to severe sand erosion, especially in dusty environments. In the past, single layered, thick, hard metallic nitride coatings have been used to produce erosion resistance for such components. However, metal nitride coatings tend to delaminate, apparently due to high internal stress.

SUMMARY

The present disclosure relates to a coating including a method for forming such a coating on a component. The coating may include nanocrystals of a transition metal compound embedded in an amorphous phase or layered structure of transition metal compounds with an amorphous phase. The transition metal compound may be selected from the group consisting of metal nitrides, metal carbides, metal silicides and combinations thereof. The amorphous matrix may include a ceramic. The method may include depositing metal atoms on one or more component surfaces which may be subjected to reactive gas under conditions effective to produce a coating layer of a metal compound. The reactive gas may include a gaseous ceramic precursor.

BRIEF DESCRIPTION OF THE DRAWINGS

The detailed description below may be better understood with reference to the accompanying figures which are provided for illustrative purposes and are not to be considered as limiting any aspect of the invention.

DETAILED DESCRIPTION

The present invention relates to an erosion resistant protective coating. The coating may include metal compounds such as metal nitrides, metal carbides, metal silicides and combinations of these compounds. The coating may be produced from a number of methods and systems. Such a method or system may be adapted to deposit metal atoms onto the surface of the component in the presence of reactive gas under conditions effective to produce the desired protective coating. Exemplary systems may include magnetron sputtering systems, arc deposition systems, reactive evaporation systems, arc evaporation systems, sputter chemical vapor deposition systems, reactive magnetron sputtering systems, hollow cathode magnetron sputtering systems, plasma enhanced magnetron sputtering systems, and other suitable systems.

In one exemplary embodiment, the coating may be prepared using a conventional magnetron sputtering system. A magnetron may be placed into a vacuum chamber. After the system has been evacuated, an inert gas, such as Ar, may be fed into the system to a pressure of about a few millitores. A negative voltage, typically several hundred volts, may be applied to the magnetron, generating "magnetron plasma" in front of the magnetron. The negative bias on the magnetron draws ions from the plasma towards the target, thereby resulting in ion sputtering of the target material (Ti, for instance), which may be subsequently deposited onto samples placed downstream of the magnetron, forming a metal deposit (e.g., Ti). If a reactive gas is used, such as nitrogen, then metallic nitrides (e.g., TiN) may be formed.

Using conventional magnetron sputtering, a few variables may control the quality of the coating. For example, the bias voltage on the magnetron can be varied so that the ion energy may be adjusted. However, if the ion energy is too high, atoms of inert gas (typically Ar) may become incorporated into the film, which may cause spallation. Another parameter is the ion-to-atom ratio, which may account for the number of ions that arrive at the surface of the workpiece(s) in order for an atom to be deposited onto the surface of the workpiece(s). A higher ion-to-atom ratio may lead to a relatively higher quality film, which may be dense and smooth. To increase the ion flux to the sample surface, the power to the magnetron may be increased, but increasing the power to the magnetron may also increase the rate of deposition of metal atoms onto the workpiece(s). Because of the net increase in deposited metal atoms, the ion-to-atom ratio may not increase proportionately with the ion flux.

Figure 1:
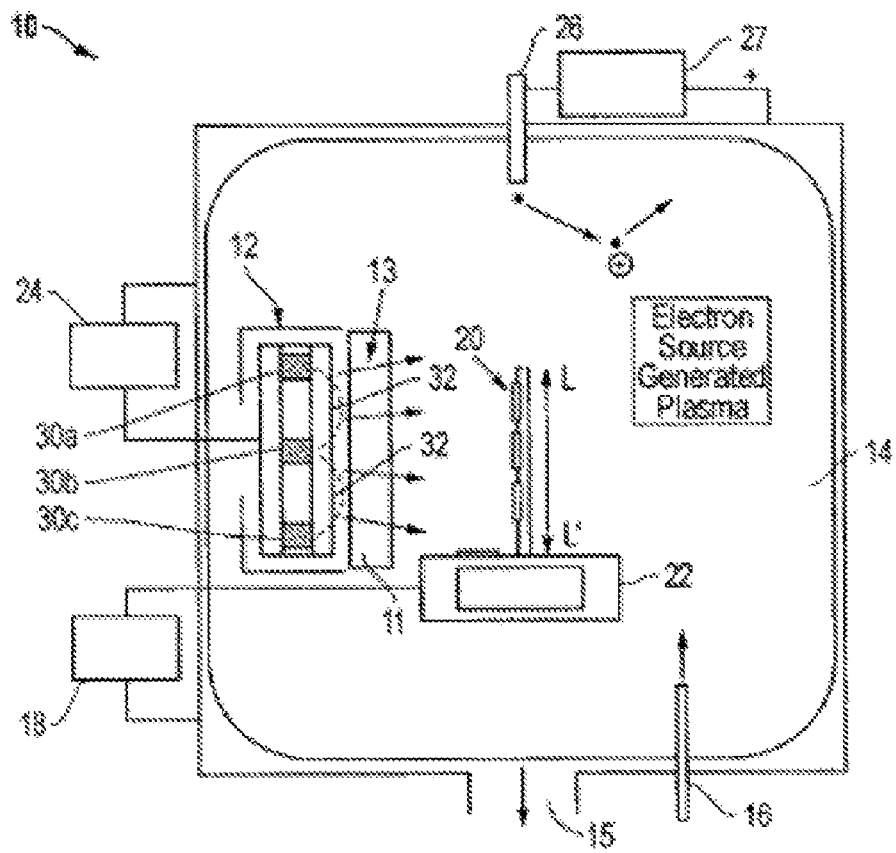
FIG. 1 is schematic of a Plasma-Enhanced Magnetron Sputtering system suitable for use in preparing a coating.

In another exemplary embodiment, the coating may be prepared using Plasma Enhanced Magnetron Sputtering (PEMS), illustrated in FIG. 1, using a magnetron sputtering system comprising an independently controllable electron source. The magnetron sputtering system 10 may include a magnetron 12 in a vacuum chamber 14 having a gas port 16 and a pump 15 in fluid communication with the vacuum chamber 14. Suitable gas feeds for introduction through gap port 16 comprise reactive gas, which may be supplied in combination with inert gas. The combination of inert gas and reactive gas may be referred to as "mixed gas." Inert gasses may include, for example, argon, krypton, xenon and combinations thereof.

Reactive gasses may include, for example, nitrogen, carbon, silicon and combinations thereof. In addition, reactive gasses may include other elements such as oxygen, hydrogen and combinations thereof. However, fluorine may not be included. Accordingly, other reactive gasses may include nitrogen, methane, acetylene, oxygen, ammonia, silanes, methyl-substituted silanes, and combinations thereof. The gas feed may also include a gaseous ceramic precursor where the desired protective coating may be a nanocomposite. The gaseous ceramic precursors may include one or more methyl-substituted silane(s), most preferably trimethyl silane.

The magnetron sputtering system may include an electron source 26. Electron sources may include, for example, filament(s), hollow cathode(s), RF antenna(s) and microwave generator(s). The magnetron sputtering system 10 may provide an energy source 24 for negatively biasing the magnetron 12, an energy source 18 for negatively biasing the surface of the workpiece(s) 20, and an energy source 27 for negatively biasing the electron source. The energy source may be a voltage source and may be associated with circuitry. The energy source may provide radio frequency (RF) or native voltage in the form of DC power or pulse DC power. Where DC power or pulse DC power is used, a voltage control may be activated to negatively bias the respective component.

The magnetron 12 may assume any structure effective to produce a substantially uniform magnetron generated plasma 13 along the length L-L' of the workpiece(s) 20. For example, the magnetron may be a planar magnetron, which may be understood as a magnetron that may include one or more permanent magnets aligned adjacent to one another with oppositely orientated poles. The ends of the magnets 30a and 30c may be the North pole of the respective magnet and the end of the adjacent magnet 30b may be the South pole. The magnets generate north to south magnetic fields 32, which may be along the length of the sputter target material 11. The magnets may generally produce a magnetic filed of about 500 Gauss or more, including 1,000 Gauss or more.

The ion current density generated by the magnetron 12 may be relatively uniform along the length of the sputter target material 11. The ion current density generally may be from about 0.01 mA/cm$^2$ to about 500 mA/cm$^2$, including all values and increments therein, such as 20 mA/cm$^2$. The rate of decay of the sputter target material 11 and the amount of metal atoms deposited onto the surface of the workpiece(s) 20 may be substantially uniform along the length of (L-L') of the workpiece(s) 20. About 20 wt. % or less of the target material may be used, including all values and increments therein, such as less than 10 wt. %, 3 wt. %, etc.

The magnetron sputter assembly 10 may be useful to deposit substantially any sputter target material 11 amenable to sputter deposition. The sputter target material 11 may be selected on the basis of application requirements, including but not limited to wear resistance, corrosion resistance, high temperature erosion resistance, and combinations thereof. The sputter target material may be metal. The deposited coatings may include metal nitrides, ceramic coatings and combinations thereof. For example, in one embodiment, the coating may be a ceramic matrix including embedded nanocrystals of metal compounds. The metal compounds may include metal nitrides, metal carbides, and combinations thereof. In another embodiment, the coating may be a multilayer structure including alternate layers of metal and metal compounds that may include a reaction product a metal and one or more other elements such as silicon, carbon, nitrogen or combinations thereof.

The sputter deposition target may include one or more transition metals. Exemplary metals include, but are not limited to, tantalum, hafnium, niobium, vanadium, molybdenum, titanium, boron, zirconium, aluminum, iron, copper, chromium, platinum, palladium, tungsten, and combinations thereof. Suitable ceramics may include, for example, nitrides, carbides, silicon, germanium and combinations thereof. For example, in one embodiment, the ceramic may have the formula SiN$_x$ wherein x is from 0.5 to 2. In another embodiment, the ceramic may be amorphous SiC$_x$N$_y$ wherein x is from 0 to 1.5 and y is from 0 to 1.5.

Magnetron sputtering systems may utilize a number of variables, which may be material dependent. Accordingly, as described herein, variables considered may be those associated with the use of titanium nitride, however it should be appreciated that other materials may be utilized herein and may allow for the adjustment of other variables. The magnetron sputtering system 10 may be evacuated via a pump 15 to a pressure of about $10^{-6}$ to $10^{-5}$ torr. Mixed gas, such as argon and nitrogen, present at about 80 vol. % argon and about 20 vol. % nitrogen, may be fed through port 16 and into the vacuum chamber 14. Suitable feed rates may be from about 150 to 200 standard cubic centimeters per second (sccm), including all values and increments therein, such as 190 to 200 sccm. Where nanocomposites may be contemplated, the mixed gas may also include gaseous ceramic precursor. The gas may be injected at a pressure of about 1 to 10 millitorr and may be continuously fed into the chamber through the duration of the process.

The magnetron 12 may be negatively biased at about 2 kW or more, such as in the range of 2 to 10 kW, about 4 kW to 10 kW, etc., via the energy source 24, including all values and increments therein. The worktable 22, and thereby the workpiece(s) 20, may be negatively biased at about 20 V or more, e.g. up to about 200 V, including all values and increments between 20 V and 200 V therein, such as 200 V, 40 V, etc., via the energy source 18. The electron source 26 may be negatively biased at about 50 V or more, e.g. up to 120 V, such as about 75 V, 120 V, etc., via the energy source 27, including all values and increments therein. The electron source may also provide a current to the worktable of about 1 A or more, e.g. up to about 20 A, including all values and increments between 1 A and 20 A, such as 10 A. Ions from the magnetron plasma may be accelerated toward the sputter target material 11 with sufficient energy to remove or sputter atoms from the target material 11. The sputtered metal atoms maybe deposited onto the surface of the negatively biased workpiece(s) 20 to form a substantially uniform metallic coating having a desired thickness. As used herein, the phrase "substantially uniform coating" refers to the surface of the workpiece(s) being completely covered by a coating having a desired thickness, preferably, a coating having a uniformity of thickness of about +/−20% or less of the desired coating thickness along it length.

The electron source 26 may inject electrons into the vacuum chamber 14. The bias on the workpiece(s) 20, including the deposited metal atoms, draws injected electrons into the vacuum chamber 14 where the electrons may collide with atoms of the gas. The high energy collision(s) cause ionization and production of "electron generated plasma" in substantially the entire vacuum chamber with a large volume. As a result, a large number of electron generated plasma ions may bombard the surface of the workpiece(s) 20 comprising the deposited metal atoms, producing the protective coating including the reaction product of the metal atoms and the reactive gas(es). The electron discharge conditions may be effective to induce the reactive gas to react with the metal atoms to form the desired coating, (e.g. N reacts with Ti to form TiN.) The electron discharge conditions may generally include a temperature of about 200° C. or higher, e.g. up to about 500° C., including all values between 200° C. and 500° C. and increments therein. For example, for TiN, suitable electron discharge conditions may generally comprise a temperature of about 400° C.

In a preferred embodiment, the discharge current of the electron source may be independently controllable, which may allow for increasing the ion-to-atom ratio. The "ion-to-atom ratio" may be defined as the ratio of each arriving ion to the number of metal atoms present at the surface of the component or workpiece(s). The required ion-to-atom ratio will vary according to the mass and energy of the ion species. The ion-to-atom ratio may be at least 0.01 ion(s) for every metal atom present at the surface of the component or workpiece(s).

The increase in ion-to-atom ratio produced using an electron source may be reflected in an increase in current (A) to the worktable 22. The electron source may be operated at a discharge current which is effective to increase the current to the worktable compared to the current to the worktable produced under the same condition in the absence of the electron source. The electron source may be operated at a discharge current effective to produce a current to the worktable 22 which may be five times greater or more, including all increments or ranges there, such as 8 times greater or more, 10 times greater or more, etc., relative to the current to the worktable 22 produced in the absence of the electron source. Suitable discharge currents may vary with the desired ion-to-atom ratio, but generally may be about 1 A or more, e.g. up to 20 A, including all ranges and increments therein such as 10 A, depending on the size of the vacuum chamber and the total surface area of the workpiece(s) 20.

For example, at an Ar pressure of 3 millitorr with a Ti target of 6.75" in diameter and operated at 4 kW, the current to the worktable of about 4"×4" may be about 0.02 A without the electron-generated plasma. In contrast, under the same magnetron condition, with a discharge current of 10 A at the DC power supply between the electron source and the chamber wall, the current to the worktable may be 0.4 A, an increase of about 20 times. The increase in ion-to-atom ratio may greatly increase the coating quality, forming ultra-thick coatings with excellent adhesion to the substrate. Using this technology, an adherent erosion resistant coating of 40 μm TiN and 80 μm ZrN have been deposited onto steel and Ti substrates.

The deposition process may be continued for a period of time sufficient to form a substantially uniform protective coating having a desired thickness. Where the coating may consist essentially of metal nitride(s) and/or metal carbide(s), suitable thicknesses may be about 25 micrometers or more, including 35 μm or more, 40 μm or more, etc., as measured by scanning electron microscope (SEM) calibrated using National Institute of Standards and Technology (NIST) traceable standards. Where the coating may be a nanocomposite, suitable thicknesses may be about 10 μm or more, e.g. up to 40 μm, including all values and increments therein, such as 25 μm to 30 μm, as measured by SEM. The coating thickness may also be measured by other suitable methods, for example, stylus profilometer measurement. The deposition time period required to achieve such thicknesses may generally be about 4 hours to about 7 hours, including all values and increments therein, such as 5 hours to 6 hours.

In another embodiment, the nanocomposite coating may be produced in the form of a multilayer structure composed of a metal-silicon-nitride or metal nitride "hard" layer and a metal "soft" layer. The multilayer structures may have improved fracture toughness and resistance to fatigue cracking compared to monolithic coatings.

Figure 2:
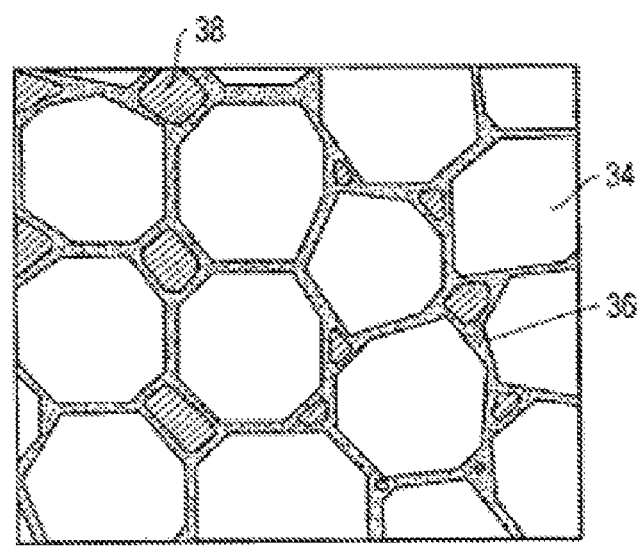
FIG. 2 is a schematic illustrating the morphology of and exemplary nanocomposite coating.

The present application is also directed to erosion resistant nanocomposite coatings and to their production. FIG. 2 is a schematic diagram of an exemplary nanocomposite comprising metal nitride nanocrystals 34 and metal silicide nanocrystals 38 embedded in an amorphous matrix 36. In one embodiment, the amorphous matrix 36 may be a ceramic which may include an inorganic non-metallic material. The nanocrystals 34, 36 may have a grain size of greater than about 2 nm, and may be, e.g. from about 2 nm to about 10 nm, including all values and increments therein. The amorphous matrix may include the reaction product between nitrogen, carbon and combinations thereof, with an element such as silicon, germanium and combinations thereof.

In one exemplary embodiment, the amorphous phase may be $SiN_x$. In one embodiment, for producing such a nanocomposite coating, a Ti magnetron target and a Si magnetron target may be provided, and the gas mixture may comprise Ar and nitrogen. Although this method may produce a nanocomposite coating, the Ti and Si magnetron targets are two different solid targets, which likely may have different locations with respect to the workpiece(s) 20. The resulting nanocomposite coating may have a non-uniform composition with higher concentrations of Ti in some areas and a higher concentration of Si in other areas. Rotation of the worktable may increase coating uniformity, but may also form a layered structure of $TiN/Si_3N_4/TiN/Si_3N_4$ instead of a nanocomposite structure.

In one exemplary embodiment for forming substantially uniform nancomposite coatings, the gas comprises argon, nitrogen, and a gas precursor for the ceramic matrix. In order to produce $TiN/Si_3N_4$, a mixed gas precursor comprising $TiCl_4$ and $SiH_4$ may be used.

In another exemplary embodiment, solid metal may be used as the source of metal atoms and a gaseous ceramic precursor including one or more elements such as carbon, silicon and combinations thereof may be used. The gaseous ceramic precursor may also include oxygen, hydrogen and/or nitrogen. In addition, the gaseous ceramic precursor may include other elements, except for fluorine. Exemplary suitable gaseous precursors may include, for example, alkyl-substituted silanes, siloxanes, alkyl substituted siloxanes, and combinations thereof.

Alkyl-substituted silanes may include, for example, methyl-substituted silanes having from about 1 to 4 methyl groups. Examples of such methyl-substituted silanes may include methylsilane, dimethylsilane, trimethylsilane, tetramethylsilane and combinations thereof. Methyl-substituted silanes, such as trimethylsilane having the formula $((CH_3)_3SiH)$, may be flammable, but generally may be non-pyrophoric and may not require special equipment. Methyl-substituted silanes may be handled in the same way as many flammable gases such as $H_2$, $CH_4$, or $C_2H_2$. For example, the protective coating may have the formula $MSiC_xN_y$, wherein M is a transition metal and x and y independently are from 0 to 1.5. M, for example, may be titanium and the protective coating may include nanocrystals of titanium nitride embedded in amorphous $SiC_xN_y$.

The nanocomposite coatings may also include a multilayer structure including alternating layers of metal compound and metal. The multilayer nanocomposite may include a base layer, or a layer immediately adjacent to the surface being coated. The base layer may be a metallic layer or a metal compound layer. The metal compound layer may be harder than the metal layer, and may include a reaction product of metal one or more elements such as silicon, carbon, nitrogen and combinations thereof. The multilayer structures may have improved fracture toughness and resistance to fatigue cracking compared to monolithic coatings.

The multilayer nanocomposite coatings may be deposited using number of systems and methods alluded to above. In one exemplary embodiment, the multilayer coating may be deposited using PEMS, wherein the source of the metal atoms may be a solid metal and the gaseous mixture may be alternated periodically between inert gas and mixed gas. For example, the magnetron sputtering system 10 may be initially evacuated via the pump 15 to a pressure of about $10^{-6}$ to $10^{-5}$ torr. Inert gas may be fed through the gas port 16 and into the vacuum chamber 14, at a rate from about 150 sccm and a pressure of about 1 to 10 millitorr. The gas may be substantially continuously fed into the chamber through the duration of the process.

In order to deposit a metallic base layer, the magnetron 12 may be negatively biased at about 2 kW or more, e.g. up to about 10 kW including all values and increments therein, such as 2.7 kW, via the energy source 24. The worktable 22, and the workpiece(s) 20, may be negatively biased from about 20V or more, e.g. to about 200 V, including all increments and values therein, such as 40V, via the energy source 18. The electron source 26 may be negatively biased at about 50 V or more, e.g. to about 120 V, including all values and increments therein such as 75 V, via the energy source 27 to provide a current to the worktable of about 1 A or more, e.g. to about 20 A, including all values and increments therein, such as about 11 A. Ions from the magnetron plasma may be accelerated toward the sputter target material 11 with sufficient energy to remove or sputter atoms from the target material 11.

The sputtered metal atoms may be deposited onto the surface of the negatively biased workpiece(s) 20 under electron discharge conditions effective to form a substantially uniform metallic layer having a desired thickness. Suitable thicknesses for the metallic layer may be from about 0.5 µm to about 10 µm, including all values and increments therein, such as 1 µm. The electron discharge conditions may be maintained from about 10 to about 60 minutes, including all values and increments therein.

Either initially, or once a metallic layer having a desired thickness is formed, one or more reactive gases may be introduced into the chamber. The gasses may include mixed gas including inert gas. The workpiece(s) may then be exposed to electron discharge conditions effective to produce a metal compound layer having a desired thickness from about 1 µm to about 25 µm, including all values and increments therein, such as about 5 µm. The electron discharge conditions may be maintained for a period of about 10 to about 60 minutes, including all values and increments therein. In an exemplary embodiment for producing, for example, a metal nitride layer, the mixed gas may include argon and nitrogen, the argon present at about 80 vol. % and the nitrogen present at about 20 vol. %, as measured by mass flow rates. In one embodiment for producing, for example, metal nitride, a suitable flow of argon may be about 150 sccm and a suitable flow of nitrogen may be about 40 sccm. The temperature may be maintained at about 200° C. or more, e.g. to about 500° C., including all values and increments therein, such as 350° C. For TiN, a suitable temperature may be about 400° C.

After about 10 to 60 minutes, the flow of reactive gas may be stopped, and the entire procedure may be repeated until a multilayer protective coating having a desired thickness is produced. Suitable multilayer coatings may have a thickness in the range of about 10 µm or more, e.g. to about 200 µm, including all values and increments therein, such as 25 µm to about 100 µm, as measured by SEM. The total time period required to achieve such thicknesses may be about 2 hours or more, e.g. up to 12 hours, including all values and increments therein, such as 6 hours to 8 hours.

Upon completion, the coated workpiece(s) 20 may be removed from the vacuum chamber 14. The properties of the protective coatings may be evaluated and/or described by a number of procedures, such as by sand erosion tests and various hardness quantifiers.

In one method, the protective coating may be measured by sand erosion tests, wherein the cumulative weight loss may be measured. Sand erosion tests may include any number of cycles of exposure to pressurized particles having a variety of sizes and compositions at a variety of pressures and incident angles for a variety of time periods per cycle. In one embodiment, the sand erosion tests may use alumina particles having an average grain size of 50 µm for 10 cycles of sandblasting at 80 psi at an incident angle of 30° for 10 seconds per cycle. In sand erosion tests having the following parameters, the protective coatings may produce a decrease in cumulative weight loss compared to the bare component, such as stainless steel, of about 20 wt. % or more, such as about 30 wt. % or more, 40 wt. % or more, 80 wt. % or more cubic millimeters of coating lost per gram of incident abrasive, as measured using a microbalance.

The coating may be measured by weighing the coated sample with a microbalance while the sand used may be calibrated using a beaker. The abrasive flow rate may be determined by weighing the beaker before and after the sand may be blown in under the expected test conditions for the expected sand flow duration. The microbalance may have an accuracy of about 10 micrograms or less.

Hardness may be tested using a nano-hardness tester (NHT). The NHT, also sometimes called a nano-indenter or a "Berkovich" indenter, may be a high precision instrument for the determination of the nano mechanical properties of thin polymer films, coatings and substrates. The nano-hardness tester may especially be suited to load and penetration depth measurements at nanometer length scales. A typical nano-hardness tester may have the following specifications:

| Maximum Displacement | 10 µm |
|---|---|
| Displacement Resolution | 1 nm |
| Maximum Force | 300 mN |
| Force Resolution | 10 µN |

Using the NHT, properties such as Young's Modulus and hardness on soft, hard, brittle or ductile materials may be determined.

A diamond pyramid shape indenter tip, normal to the sample surface, with a known geometry may be driven into the sample by applying an increasing load up to some present value. The load may be gradually decreased until partial or complete relaxation of the sample has occurred. The load and displacement may be recorded continuously throughout the process to produce a load displacement curve. The following equations may then be used to calculate the nano-mechanical properties, such as Young's Modulus, hardness, stress-strain studies, time dependent creep measurement, fracture toughness, plastic and elastic energy of the sample material:

$$E_r = \frac{\sqrt{\pi}}{2} \frac{S}{\sqrt{A_c}}$$

$$\frac{1}{E_r} = \frac{1-v^2}{E} + \frac{1-v_i^2}{E_i}$$

$$H = \frac{P_{max}}{A_c}$$

wherein $E_r$ is the reduced modulus (GPa), S is the contact stiffness, v is Poisson ratio, E is Young's modulus (GPa), $P_{max}$ is the maximum load (µN) and H is hardness (MPa).

The nano-hardness testing may be repeated at different positions for each sample and an average may be determined. The position of the indicator relative to the sample surface may be monitored with a differential capacitive sensor. For each loading/unloading cycle, the applied load value may be plotted with respect to the corresponding position of the indicator. The Young's modulus and the hardness may be determined and plotted against relative mass fraction. The resulting load/displacement curves may provide data specified to the mechanical nature of the material under examination. Established models may be used to calculate quantitative hardness and modulus values for such data.

Figure 8:
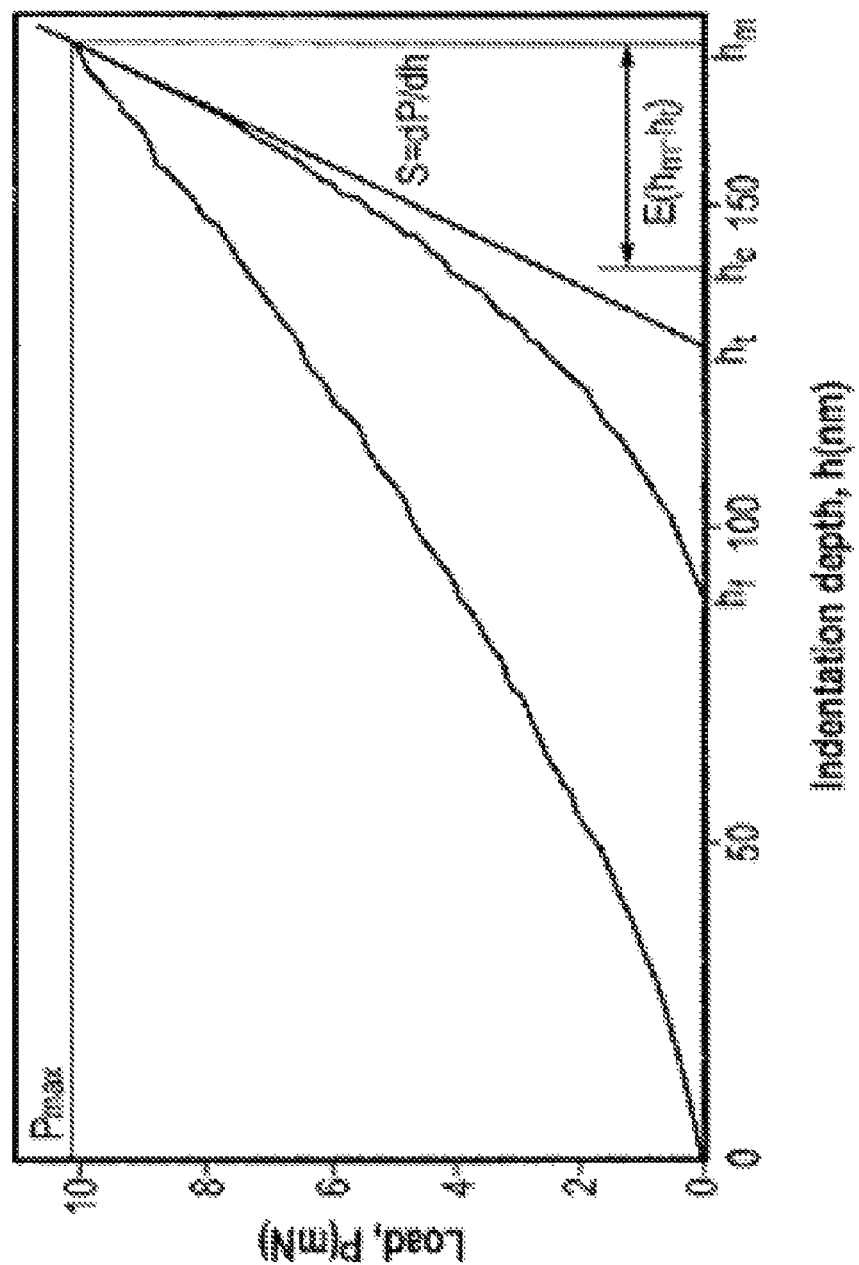
FIG. 8 is an exemplary load displacement curve from nano indentation testing.

An exemplary embodiment of a load/displacement curve is illustrated in FIG. 8. The compliance C=1/S, S being the contact stiffness, and contact depth $h_c$ may be determined after correction for thermal drift. A simple linear fit through the upper third of the unloading data intersects the depth axis at $h_r$. The stiffness, S, may be given by the slope of this line. The contact depth, $h_c$, may then be calculated as:

$$h_c = h_m - \epsilon(h_m - h_t)$$

where $\epsilon$ depends on the investigated material and $h_m$ is the power law constant.

Another approach may be used where a power law function may be used to describe the upper 80% of the unloading data.

$$P = P_{max}\left[\frac{h - h_0}{h_m - h_0}\right]^m$$

wherein m and $h_o$ may be determined by a least squares fit. The contact stiffness $S=(-1/C)$ may be given by the derivative at the peak load:

$$S = \left[\frac{dP}{dH}\right]_{max} = mP_{max}\left[\frac{(h_m - h_0)^{m-1}}{(h_m - h_c)h_m}\right] = mP_{max}(h_m - h_o)^{-1}$$

and the tangent depth, $h_t$, is thus given by:

$$h_t = h_m - \frac{P_m}{S}$$

The contact depth, $h_c$, is then:

$$h_c = h_m - \epsilon(h_m - h_t)$$

where $\epsilon$ depends n the power law exponent, m. Such an exponent may be summarized for different indenter geometries:

| Elastic indentation behavior (indenter geometry) | m (power law exponent) | $\epsilon$ |
|---|---|---|
| Flat | 1 | 1 |
| Paraboloid | 1.5 | 0.75 |
| Conical | 2 | 0.72 |

There may be variation in the results with nano-indentation due to the fact that the indentation sizes are often of the same order of magnitude as the surface roughness of the samples.

Young's Modulus may be calculated by the reduced modulus. The reduced modulus, $E_r$, is given by:

$$E_r = \frac{\sqrt{\pi}}{2}\frac{S}{\sqrt{A_c}} = \frac{\sqrt{\pi}}{2}\frac{1}{C}\frac{1}{\sqrt{A_c}}$$

which may be calculated having a derived S and $A_c$ from the indentation curve using the area function, $A_c$, being the projected contact area. The Young's Modulus, E, can then be obtained from:

$$\frac{1}{E_r} = \frac{1-\nu^2}{E} + \frac{1-\nu_i^2}{E_i}$$

where $E_i$ and $\nu_i$ are the Young's Modulus and Poisson coefficient of the indenter and $\nu$ the Poisson coefficient of the tested sample.

The nanocomposites preferably exhibit a Young's modulus (E) effective to produce a ratio of $H^3/E^2$ of about 0.150 or more, including 0.175 or more. The Young's Modulus may be about 420 kPa or more, including 425 kPa or more. The nanocomposites may produce an X-ray diffraction pattern indicating a cubic structure having a preferred orientation, as evidenced by a single peak having an intensity of 1000 or greater.

The hardness may be determined from the maximum load, $P_{max}$, divided by the projected contact area, $A_c$:

$$H = \frac{P_{max}}{A_c}$$

Vickers Hardness may be understood as a standard method for measuring the hardness of metals, particularly those with relatively hard surfaces. In one embodiment, the surface may be subjected to a standard pressure for a standard length of time by means of a pyramid-shaped diamond. The diagonal of the resulting indentation may be measured under a microscope and the Vickers Hardness value read from a conversion table.

The indenter employed in the Vickers Hardness test may be a square-based pyramid whose opposite sides meet at the apex at an angle of 136°. The diamond may be pressed into the surface of the material at loads of about 1 to about 120 kilo-grams force, and the size of the impression may be measured with the aid of a calibrated microscope. This Vickers number (HV) may be calculated using the following formula:

$$H = \frac{P}{0.5393d^2}$$

where HV is the Vickers Hardness number, P is the imposed load (kg), and d is the diagonal of indentation (mm).

Any suitable indenter may be used to measure Vickers Hardness. Indenters may include, for example, Wilson Toucon microhardness tester and the CSM Instruments nano-indenter. The nanocomposite coatings may exhibit a Vickers hardness of about 2500HV or more as measured using a Wilson Toucon microhardness tester at 25 gm pressure.

Vickers hardness also may be calculated from the nano-hardness H. The difference between HV and nanohardness H is that HV=load/contact area (kg/mm²) and H=load/projected contact area (GPa, N/mm²). The geometry of the Berkovich indenter is known and projected contact area=k*contact area.

The following examples are presented for illustrative purposes only and are not meant to limit the scope of this application.

Example 1

A number of metal nitride coatings were prepared using a PEMS system, illustrated in part in FIG. 1. Stainless steel coupon(s) each having a surface area of about 1 inch in diameter were affixed to the worktable. The coupons were sputtered cleaned with Ar for 90 minutes at a pressure of about 2.7 millitorr. The Ar flow rate was 150 standard cubic centimeters per second (sccm). The bias voltage on the worktable was 120 V and the current was 0.35 A. The discharge voltage was 120 V and the current was 10 A. The magnetron was provided with a metal sputter deposition target of Cr, Zr, or Ti. The magnetron was biased at about 4 kW and metal was deposited on the sample(s). Nitrogen was added to the argon to a total of about 20 vol. % based on the total volume of the mixed gases. The DC power supply was activated to produce a discharge current of about 10 A between the electron source and the chamber wall. The resulting current to the 4"×4" worktable was about 0.4 A.

Example 2

Nanocomposite coatings were produced using the following procedures. Metal coupons were sputter cleaned with Ar for 90 minutes at a pressure of about 2.7 millitorr. The Ar flow rate was 150 standard cubic centimeter per second (sccm). The bias voltage on the worktable was 120 V and the current was 0.35 A. The discharge voltage was 120 V and the current was 10 A.

Stainless steel coupon(s) each having a surface area of about 1 inch in diameter were affixed to the worktable. The magnetron was provided with a single Ti sputter deposition target. The samples were fixed in front of the target. The magnetron was powered at 4 kW at a voltage of 445 V and a current of 9 A. The worktable was provided with a bias voltage of 40 V and a current of 0.25 A. The electron source was provided with a discharge voltage of 120 V and a discharge current of 10 A. Mixed gas was introduced into the vacuum chamber at the following flow rates: Ar, 150 sccm; nitrogen, 23 sccm; trimethylsilane, 3 sccm. The total pressure was about 2.7 millitorr. The deposition was continued for about 5 hours. These coupons may be referred to as TiSiCN-8 coupons.

Stainless steel coupon(s) each having a surface area of about 1 inch in diameter were affixed to the worktable. The magnetron was provided with two Ti sputter targets. The Ti targets were powered at 3 kW each. The voltage for Target 1 was 540 V and the current was 5.56 A. The voltage for Target 2 was 480 V and the current was 6.16 A. The electron source was provided with a discharge voltage of 120 V and a discharge current of 10 A. Mixed gas was introduced into the vacuum chamber at the following rates: Ar, 150 sccm; nitrogen, 35 sccm; trimethylsilane, 3.5 sccm. The total pressure was about 2.9 millitorr. The samples were rotated in the center of the two magnetrons. The deposition was continued for about 6 hours. These coupons may be referred to as TiSiCN-9 coupons.

Coatings having the following compositions and thicknesses were formed on the stainless steel coupons in Examples 1 and 2:

| Composition | Thickness |
|---|---|
| CrN | 60 |
| ZrN | 80 |
| TiN | 40 |
| ZrSiCN | 40 |
| TiSiCN | 33 |

The increased ion-to-atom ratio produced coatings using the electron source greatly increased the coating quality (forming ultra-thick coatings with excellent adhesion to the substrate.)

Example 3

Figure 4:
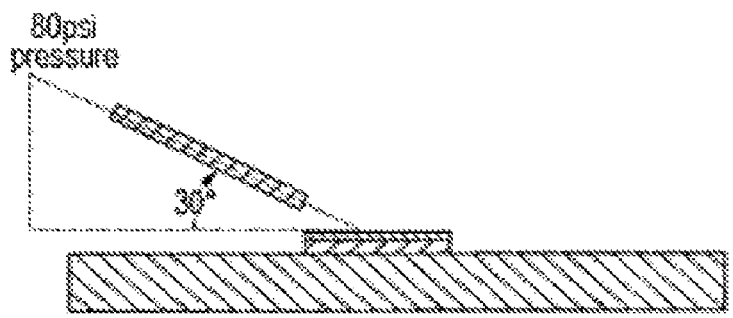
FIG. 4 is a schematic of the apparatus used to perform the sand erosion tests of Example 3.
Figure 5:
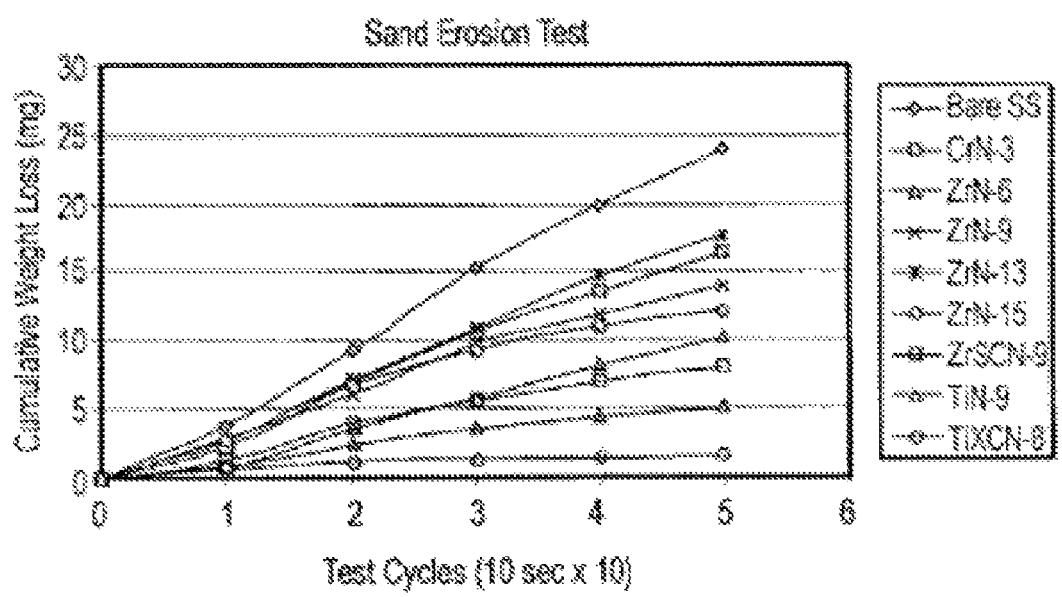
FIG. 5 is a graph of the sand erosion test data from Example 3.

The coated stainless steel coupons produced in Example 1 and samples of nanocomposite coated coupons produced in Example 2 were tested for erosion resistance using a white grit blast system, substantially as illustrated in FIG. 4. Alumina sand having an average grain size of 50 μm was blasted onto the samples at a 30 degree incident angle at a pressure of 80 psi for 10 cycles, with a single cycle being 10 seconds on, 10 seconds off. After 10 cycles, the cumulative weight loss of a bare stainless steel coupon, and the coated coupons after 10 cycles was measured. FIG. 5 is a graph of the cumulative weight loss of a bare stainless steel coupon, and the coated coupons after 10 cycles. As can be seen, all of the coated coupons experienced less cumulative weight loss than the bare stainless steel coupon. The ZrN coated coupons generally experienced less weight loss than the CrN coated coupons, while the TiN coated coupons experienced less weight loss than the ZrN coated coupons. The nanocomposite coated coupons experienced less cumulative weight loss than most of the metal nitride coated coupons, with the TiSiCN-8 coupons experiencing less cumulative weight loss, that is a weight loss which was about 10 times less than the weight loss of the bare stainless steel coupons.

Example 4

The chemical composition of the nanocomposite coatings from Example 2 were analyzed using a Philips XL 30S SEM with field emission gun. The acceleration energy was 15 kV, and a super-ultra thin polymer window was used, allowing the detection of light elements such as C and N. The results are shown in the following Table:

| | Atomic Percentage % | | | |
|---|---|---|---|---|
| Sample | Ti | Si | C | N |
| TiSiCN-8 | 31.4 | 3.5 | 28.6 | 36.5 |
| TiSiCN-9 | 42.3 | 1.9 | 14.5 | 41.3 |

Example 5

X-Ray diffraction analysis (XRD) was performed on the nanocomposite coatings produced in Example 2 using Rigaku diffractometer with a Cu $K_\beta$ radiation ($\lambda$=1.542 Å). A Ni foil filter was used to attenuate Cu $K_\beta$ radiation. The spectra were produced in a continuous scan mode at 1.8°/min, and 2θ angle range: 20-100°.

Figure 3A:
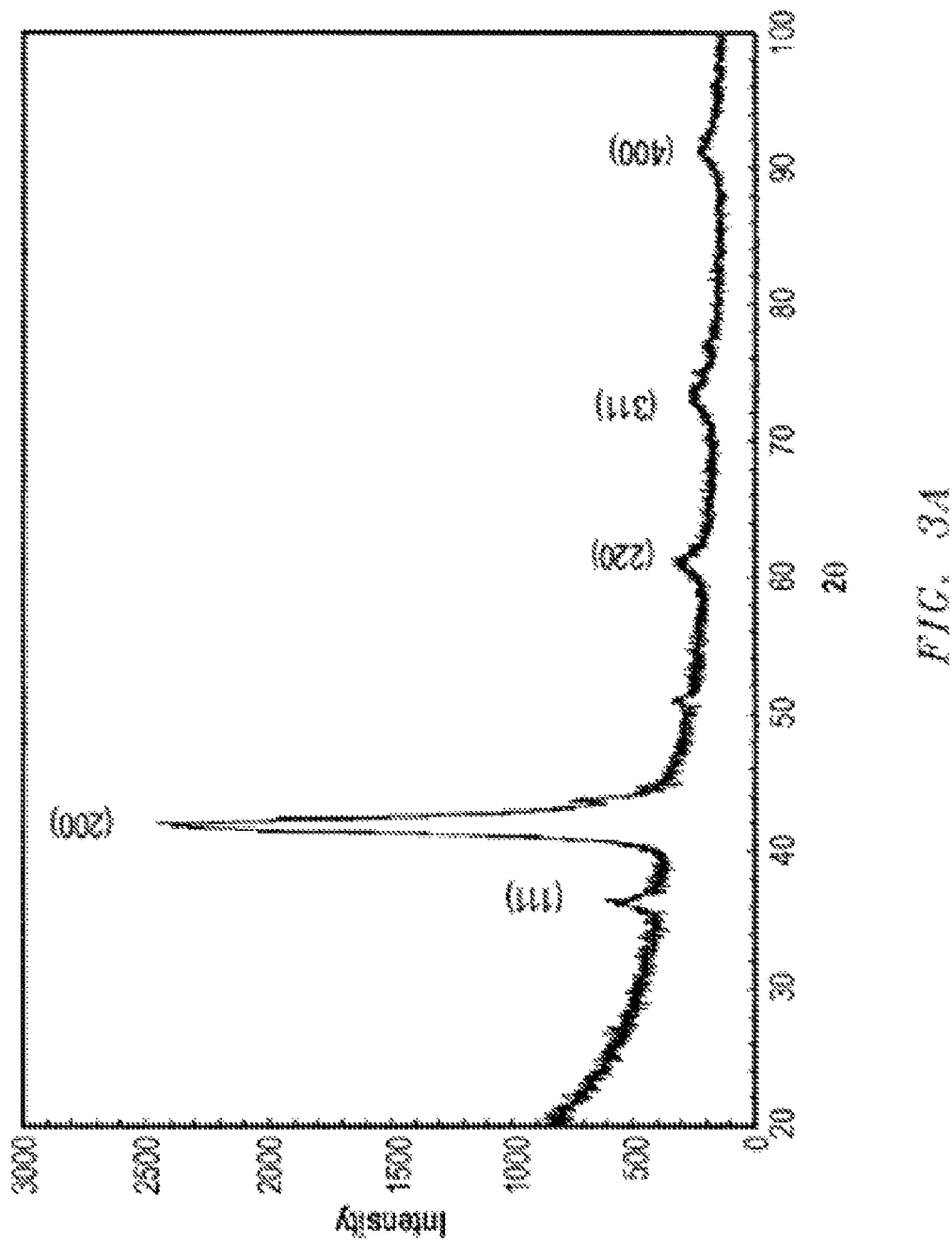
FIG. 3a is X-ray diffraction data for the nanocomposite of TiSiCN-8 from Example 2.
Figure 3B:
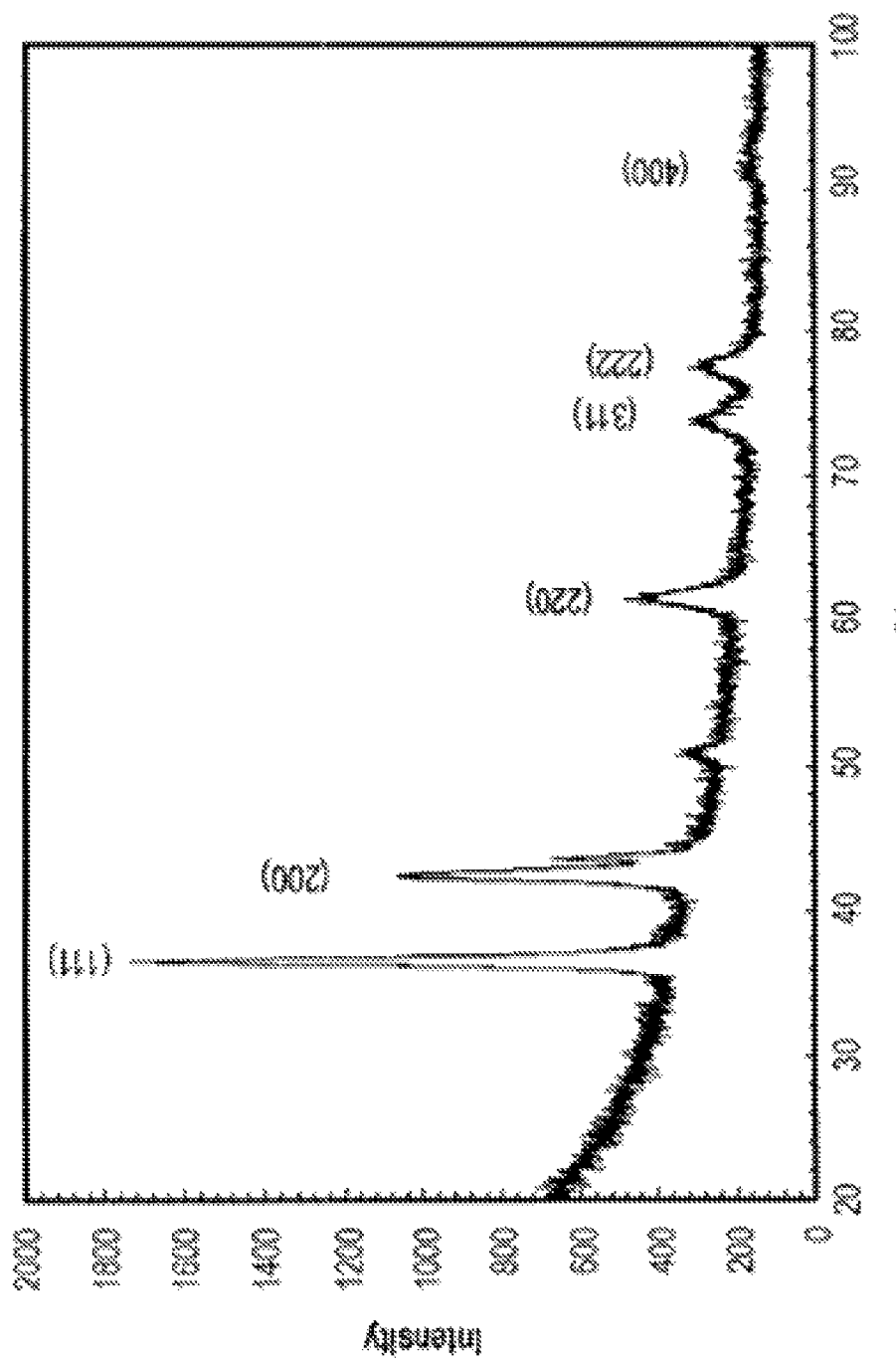
FIG. 3b is X-ray diffraction data for the nanocomposite of TiSiCN-9 from Example 3.

FIG. 3a is the X-ray diffraction analysis of the TiSiCN-8 and FIG. 3b is the X-ray diffraction analysis of TiSiCN-9. The X-ray diffraction analysis of TiSiCN-8 indicates a cubic crystalline structure with strong (200) preferred orientation. The X-ray diffraction analysis of TiSiCN-9 indicates a cubic crystalline structure with moderate (111) orientation.

Example 6

The mechanical properties of the nanocomposite coatings from Example 2 were measured by nano-indentation using a CSM Instruments nano-hardness tester with a Berkovich indenter. Hardness (H) and Young's modulus (E) were derived from the loading and unloading curves using the Oliver Pharr method using a Poisson ratio of 0.30. W. C. Oliver and G. M. Pharr, J. Mater, Res., 7 (1992) 1564, incorporated herein by reference. The area between the loading and the unloading curve represented the elastic deformation energy $W_e$. A maximum load of 50 mN was employed with a loading rate and unloading rate of 100 mN/min. The average values from seven measurements were used to represent the coating mechanical properties. The results were as follows:

| Sample | HV* | H** (GPa) | E*** (GPa) | $H^3/E^2$ (GPa) |
|---|---|---|---|---|
| TiSiCN-8 | 2931 | 31.6 | 425 | 0.176 |
| TiSiCN-9 | 2473 | 26.7 | 410 | 0.123 |

*HV: Vickers Hardness,
**H: Hardness,
***E: Young's Modulus

HV hardness was also measured by nanohardness tester, and the operation software automatically gave the H, HV and E values (from the loading and unloading curves.) The difference between HV and nanohardness H is HV=load/contact area (kg/mm$^2$) and H=load/projected contact area (GPa, N/mm$^2$).

Example 7

Erosion tests were carried out on the TiSiCN-8 and TiSiCN-9 coatings produced in Example 2 using angular Al$_2$O$_3$ particles (powder) having an average particle size of 50 µm following ASTM standard G76-02. The particle-N$_2$ gas stream was directed towards the testing coupon at an impingement angle of 90°. A particle speed of 84 meters per second (m/s) and an average particle feed rate of 1-2 g/min were used in each testing. The weight loss of the tested coupons was measured using a balance with an accuracy of 10$^{-5}$ g, and the volume loss was obtained from the weight loss divided by the coating density. The theoretical density of TiN was used to approximately represent the density of the coatings.

Figure 6:
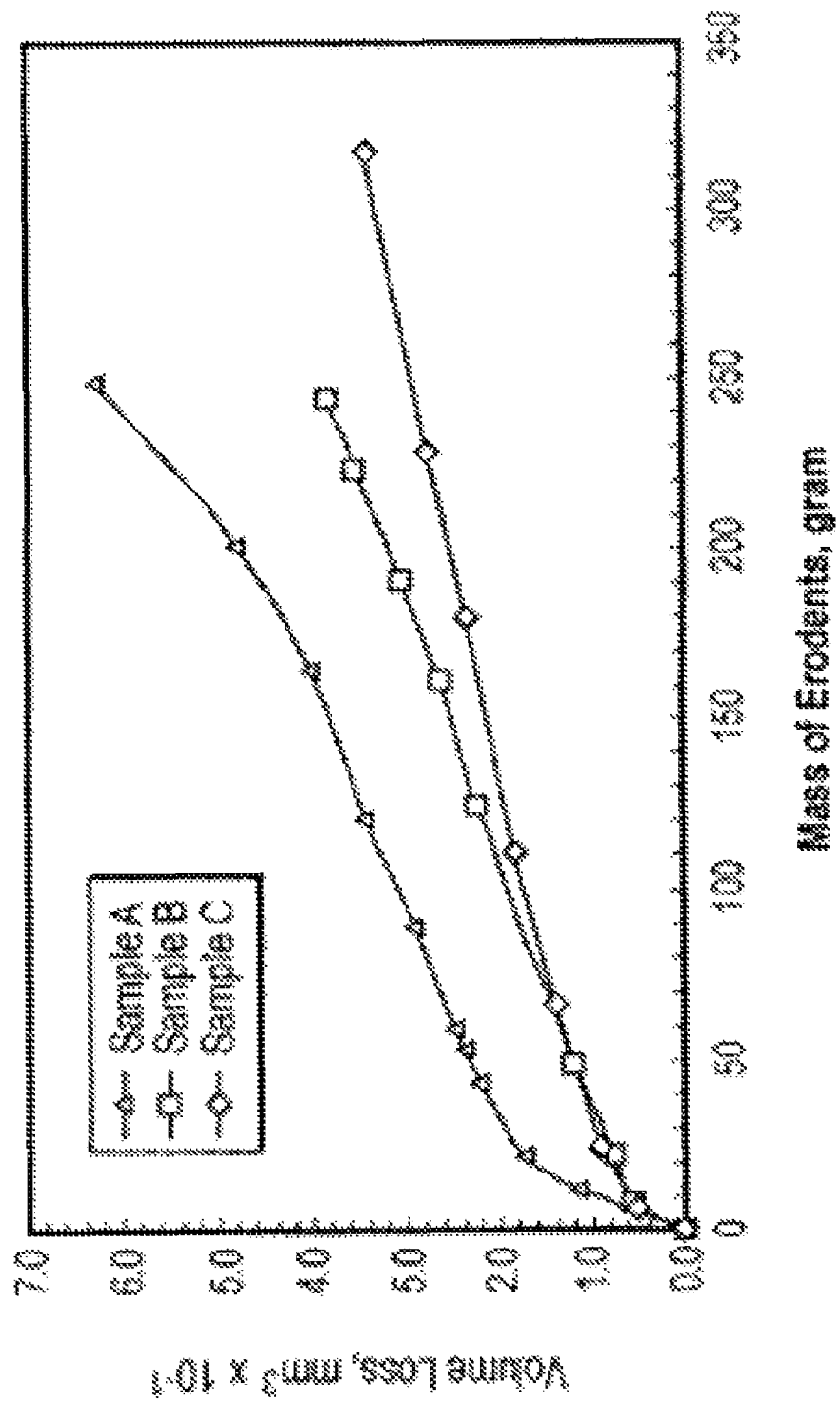
FIG. 6 is a graph illustrating the rates of erosion of three samples of TiSiCN-8 from Example 2.

The commercial TiN coating exhibited erosion loss in cubic millimeters of coating per gram of incident abrasive, of 9.36×10$^{-3}$ mm$^3$/g. The results for the TiSiCN-8 and TiSiCN-9 coatings are discussed below:

The three TiSiCN-8 coating samples showed a rapid increase in volume loss at the initial transient stage, followed by a steady stage in which the volume loss increased linearly as a function of the mass of the erodent. The results are shown in FIG. 6. The average erosion rate during the steady stage was used to represent the erosion resistance of the coatings. The TiSiCN-8 samples exhibited the following erosion losses: Sample A, 1.48×10$^{-3}$ mm$^3$/g; Sample B, 1.3×10$^{-3}$ mm$^3$/g; and Sample C, 7.88×10$^{-4}$ mm$^3$/g. TiSiCN-8 coatings exhibited significantly lower erosion rates than the reference commercial TiN coating tested under the same conditions, with Sample C exhibiting an erosion rate of one order of magnitude smaller than the TiN coating.

Large numbers of cauliflower-like defects were observed on the surface of the coatings. These defects were preferentially removed by the erodent particles, leaving numerous dents on the surface. The transient stage with high erosion rates (FIG. 6) was through to result from the rapid removal of surface particulate defects. With continuous impingement of the erodent particles, these dents became deeper and larger through chipping. Some large chipped areas were observed shortly after the erosion tests, and the substrate was exposed preferentially in these areas.

Among the three TiSiCN-9 samples, sample C had tree-branch-like arcing patterns in the middle of the coupon. The erosion crater (i.e. erosion-tested area) covered both arcing and non-arcing areas. In contrast, the arcing patterns on samples A and B were outside of the erosion craters.

Figure 7:
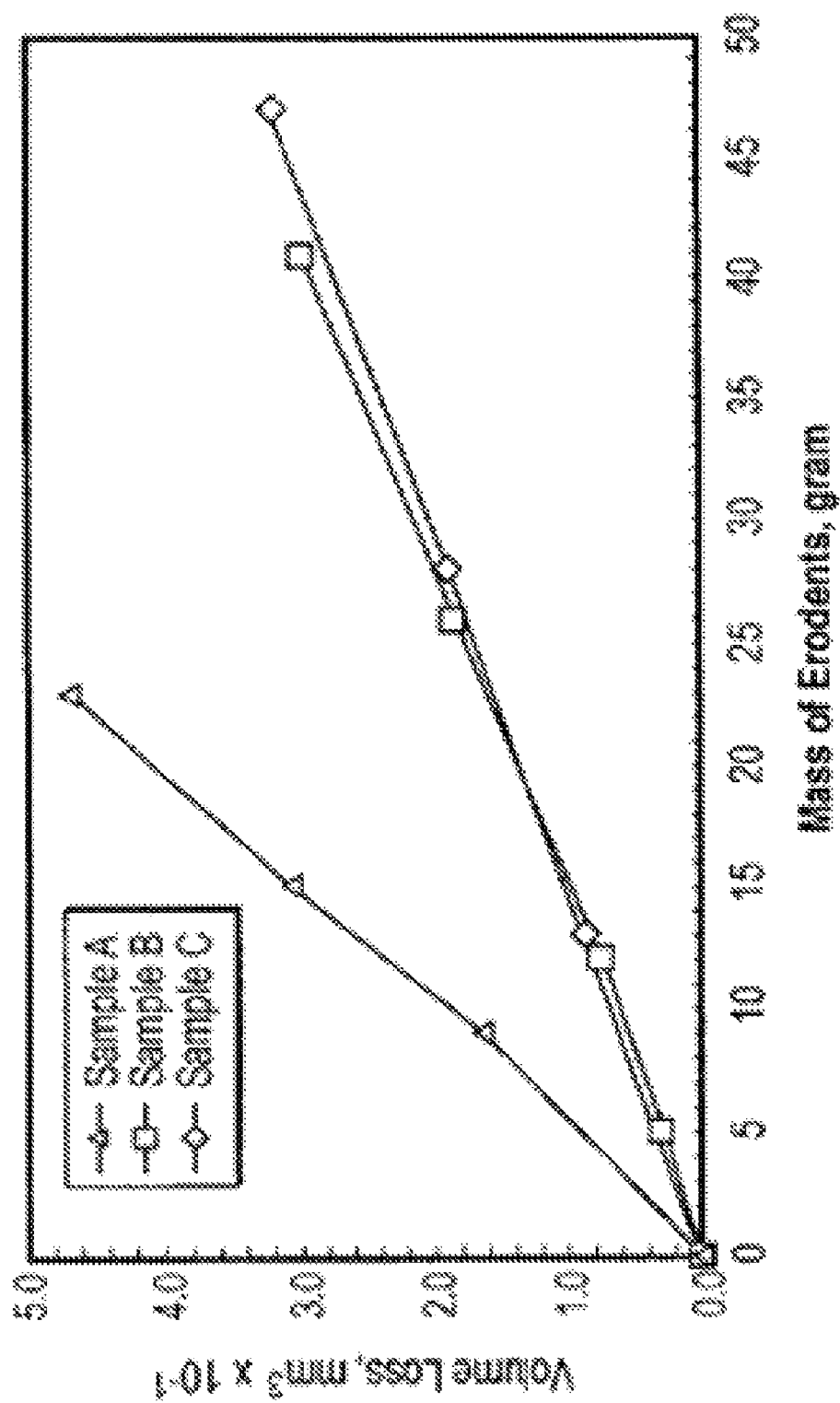
FIG. 7 is a graph illustrating the rates of erosion of three samples of TiSiCN-9 from Example 2.

All three coupons showed a linear volume loss as a function of the mass of the erodent. The results are shown in FIG. 7. The average erosion rate was used to represent the erosion resistance. The Samples exhibited the following erosion rates: Sample A, 6.84×10$^{-3}$ mm$^3$/g; Sample B, 7.43×10$^{-3}$ mm$^3$/g; Sample C, 2.06×10$^{-3}$ mm$^3$/g. Samples A and B had almost identical erosion rates, slightly lower than the erosion rate of the commercial TiN coating. However, coupon C had a higher erosion rate than the TiN coating.

For sample A or B, cauliflower-like coating defects were also relatively easily removed by the erodent particles, leaving dents on the surface. However, unlike the TiSiCN-8 coatings, the dents on TiSiCN-9 coatings expanded slowly in size. The TiSiCN-9 coatings were gradually removed mainly through the cutting mechanism by the angular erodent particles. As these coatings were relatively softer than TiSiCN-8 coatings, erosion damage by cutting became more dominant.

For sample C, the arcing area had a microstructure that was different from the non-arcing area. The arcing area first experienced a severe chipping and then particle cutting, which resulting in a markedly lower erosion resistance than the non-arcing area.

Example 8

A multilayer coating was prepared using a titanium target and a nitrogen-argon gas mixture to produce TiN layer, next the nitrogen gas was turned off resulting in a metallic Ti layer. The process was repeated six times to produce a thick (>25 µm) multilayer of TiN and Ti using the PEMS process.

| Layer | $V^1$ bias | $I^1$ bias | $V^2$ discharge | $I^2$ discharge | Magnetron Power | Ar flow (sccm) | N$_2$ flow (sccm) | time |
|---|---|---|---|---|---|---|---|---|
| Hard | 40 V | 1.1 A | 120 V | 11 A | 2.7 kW | 150 | 40 | 60 min |
| Soft | 40 V | 1.1 A | 120 V | 11 A | 2.7 kW | 150 | 0 | 10-60 min |

[1]Bias on the workpiece;
[2]Discharge voltage or current (electron source).

The foregoing description is provided to illustrate and explain the present invention. However, the description hereinabove should not be considered to limit the scope of the invention set forth in the claims appended here to.

What is claimed is:

1. A component comprising a coating, wherein said coating consists of nanocrystals of a transition metal compound embedded in a ceramic, the transition metal compound being selected from the group consisting of metal nitrides, metal carbides, metal silicides and combinations thereof and the chemical composition of said coating has the formula TiSiCN, wherein Ti is present at an atomic percentage of 31.4 to 42.3, Si is present at an atomic percentage of 1.9 to 3.5, C is present at an atomic percentage of 14.5 to 28.6 and N is present at an atomic percentage of 36.5 to 41.3, wherein the atomic percent of Ti, Si, C and N is 100 atomic percent, and said coating exhibits a cubic crystalline structure and wherein said coating exhibits a Vickers Hardness of 2473 to 2931 (HV).

2. The component of claim 1 wherein said nanocrystals have a grain size greater than or equal to about 2 nm.

3. The component of claim 1 wherein, upon exposure to sand erosion testing using alumina particles having an average particle size of about 50 μm for 10 cycles of sandblasting at 80 psi at an incident angle of about 30 degrees and 10 seconds per cycle, said coating decreases cumulative weight loss compared to stainless steel by about 20 wt. % or more.

4. The component of claim 1 wherein said coating exhibits a hardness (H) of about 30 GPa or greater.

5. The component of claim 1 wherein said coating exhibits a Young's Modulus (E) and a hardness (H), wherein the ratio of $H^3$ to $E^2$ is about 0.150 or greater.

6. A method for producing a coating on a component comprising:
   depositing metal atoms on one or more surfaces of a component; and
   subjecting said metal atoms to reactive gas under conditions effective to produce a coating layer of a metal compound, wherein said metal compound comprises nanocrystals of a transition metal compound in a ceramic matrix, wherein said transition metal compound is selected from the group consisting of metal nitrides, metal carbides, metal silicides and combinations thereof.

7. The method of claim 6 wherein said nanocrystals have a grain size of greater than or equal to about 2 nm.

8. The method of claim 6 wherein said reactive gas includes a ceramic precursor reactive gas.

9. The method of claim 6 wherein said reactive gas comprises carbon, silicon, oxygen, hydrogen, nitrogen and combinations thereof.

10. The method of claim 6 wherein said reactive gas comprises alkyl-substituted silanes, siloxanes, alkyl substituted siloxanes and combinations thereof.

11. The method of claim 6 wherein said metal is selected from the group consisting of tantalum, hafnium, niobium, vanadium, molybdenum, titanium, boron, zirconium, aluminum, iron, copper, chromium, platinum, palladium, tungsten, and combinations thereof.

12. The method of claim 6 wherein said method further comprises
   providing a vacuum chamber;
   providing a magnetron sputter target comprising metal;
   aligning one or more surfaces of said component with said magnetron sputter target;
   evacuating said vacuum chamber;
   exposing said sputter target to magnetron sputter conditions effective to produce magnetron plasma comprising atoms of said metal; and
   injecting electrons into said vacuum chamber.

13. The method of claim 6 further comprising:
   subjecting said metal atoms to inert gas, alternated with subjecting said metal atoms to said reactive gas; and
   depositing metal atoms on said one or more surfaces of component forming at least one layer of said metal and at least one layer of said metal compound.

14. A component comprising a layered coating structure comprising:
   a. one or more layers of a transition metal compound, the transition metal compound being selected from the group consisting of metal nitrides, metal carbides, metal silicides and combinations thereof; and
   b. one or more layers of a ceramic,
      wherein the chemical composition of said coating consists of TiSiCN, wherein Ti is present at an atomic percentage of 31.4 to 42.3, Si is present at an atomic percentage of 1.9 to 3.5, C is present at an atomic percentage of 14.5 to 28.6 and N is present at an atomic percentage of 36.5 to 41.3, wherein the atomic percent of Ti, Si, C and N is 100 atomic percent and said coating exhibits a cubic crystalline structure and wherein said coating exhibits a Vickers Hardness of 2473 to 2931 (HV).

15. The component of claim 14 further comprising at least one metal layer to said transition metal compound layer.

16. The component of claim 15 wherein said at least one metal layer and said transition metal compound layer have a combined thickness of greater than or equal to 10 μm.

17. The component of claim 15 wherein said metal layer has a thickness of greater than or equal to 0.5 μm to 10 μm.

18. The component of claim 15 wherein said transition metal compound layer has a thickness of 1 μm to 25 μm.

* * * * *